United States Patent
Chaiken et al.

[11] Patent Number: 5,783,262
[45] Date of Patent: Jul. 21, 1998

[54] GROWTH OF OXIDE EXCHANGE BIAS LAYERS

[75] Inventors: Alison Chaiken, Fremont, Calif.; Richard P. Michel, Bloomington, Minn.

[73] Assignee: Regents of the University of California, Oakland, Calif.

[21] Appl. No.: 762,087

[22] Filed: Dec. 9, 1996

[51] Int. Cl.$^6$ ................................................. C23C 14/08
[52] U.S. Cl. ................... 427/529; 204/192.11; 427/127
[58] Field of Search ........................... 427/529, 127; 204/192.11

[56] References Cited

U.S. PATENT DOCUMENTS

| | | | |
|---|---|---|---|
| 4,560,577 | 12/1985 | Mirtich et al. | 427/38 |
| 4,604,181 | 8/1986 | Mirtich et al. | 204/298 |
| 4,664,980 | 5/1987 | Sovey et al. | 428/421 |
| 4,828,905 | 5/1989 | Wada et al. | 428/213 |

OTHER PUBLICATIONS

UCRL-JC-122960, "NiO Exchange Bias Layers Grown By Direct Ion Beam Sputtering of a Nickel Oxide Target", R.P. Michel et al., Mar. 1, 1996.

*Primary Examiner*—Bernard Pianalto
*Attorney, Agent, or Firm*—L. E. Carnahan

[57] ABSTRACT

An oxide (NiO, CoO, NiCoO) antiferromagnetic exchange bias layer produced by ion beam sputtering of an oxide target in pure argon (Ar) sputtering gas, with no oxygen gas introduced into the system. Antiferromagnetic oxide layers are used, for example, in magnetoresistive readback heads to shift the hysteresis loops of ferromagnetic films away from the zero field axis. For example, NiO exchange bia layers have been fabricated using ion beam sputtering of an NiO target using Ar ions, with the substrate temperature at 200° C., the ion beam voltage at 1000V and the beam current at 20 mA, with a deposition rate of about 0.2 Å/sec. The resulting NiO film was amorphous.

14 Claims, 2 Drawing Sheets

GROWTH OF OXIDE EXCHANGE BIAS LAYERS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to exchange biasing using antiferromagnetic oxide layers, particularly to oxide exchange bias layers composed, for example of NiO, and more particularly to the fabrication of amorphous or crystalline NiO antiferromagnetic exchange bias layers by ion beam sputtering a NiO target in pure argon sputtering gas, without oxygen gas.

Antiferromagnetic oxide layers, such as NiO, are used, for example, in magnetoresistive readback heads to shift the hysteresis loops of ferromagnetic films away from the zero field axis. The shift brings the most sensitive part of the magnetoresistance loop close to zero field. Exchange biasing using antiferromagnetic oxide layers, such as NiO and CoO is used extensively by the magnetic recording industry in the magnetoresistive readback heads. Also, unidirectional anisotropy can be produced in a ferromagnetic film by growing it on an antiferromagnetic buffer layer, resulting in the above-referenced shift of the hysteresis loop away from the zero field axis. The most widely used fabrication process for oxide exchange bias layers has involved reactive magnetron sputtering of pure metal targets in a partial pressure of oxygen gas. This requires that the partial pressures of both the oxygen gas and the argon sputtering gas be controlled, making the fabrication process significantly more complicated. In addition, oxygen gas can have a detrimental effect on the other metal layers in the device as well as on the deposition chamber itself. Finally, the presence of oxygen gas makes it difficult to grow, for example, the NiO exchange biasing layer on top of the NiFe layer. Thus, a simpler process to produce oxide exchange bias layers is needed.

The present invention fills that need by producing oxide exchange bias layers (i.e., NiO, CoO, NiCoO) using a simpler fabrication process which involves ion beam sputtering of an oxide target using argon (Ar) ions, with no oxygen gas being introduced into the system.

Ion-beam sputter deposition (IBSD) is an increasingly important method of fabricating magnetic thin films and heterostructures for both basic research and industrial applications. While basic researchers are attracted to IBSD because of its simplicity and versatility, manufacturers are increasingly choosing IBSD because of the flexible process control it enables.

Ion-beam sputter deposition is a technique in which material that has been energetically ejected from a target using an ion beam is deposited onto a substrate. Therefore, it differs from ion milling, where an ion beam is focused directly onto a substrate in order to form a pattern on it, and ion cleaning, whereby a defocused ion beam is used to directly remove contamination from the surface of a substrate. In IBSD a focused ion beam is pointed at the sputter target, not at the substrate.

One of the principle differences between IBSD and conventional magnetron sputter deposition is that the targets are outside the sputter gun. This is also one of the main advantages of IBSD systems since changing targets is very easy and almost any large piece of material can be used as a sputter target. IBSD systems can easily be adapted to deposit material from targets in the form of rods or pellets, just as with pulsed laser deposition. Just as routinely an IBSD system can switch between conducting and insulating sputter targets without any reconfiguration of the electronics. A neutralization filament or plasma neutralizer must be used to prevent charging of insulating targets, but these features are conveniently integrated into commercial ion guns.

A possible advantage of IBSD is that deposition can routinely be performed with chamber base pressures in the $10^{-4}$ torr range rather than the $10^{-3}$ torr range commonly used for magnetron sputtering. With a well designed differential pumping scheme, even lower chamber pressures should be possible during IBSD. One cautionary note is that the maximum rates obtainable with IBSD may be somewhat lower than with magnetron deposition. With both magnetron and ion-beam sputter process parameters must be chosen which discourage incorporation of sputter gas into the deposited film. Otherwise, degraded film properties may result.

Using ion beam sputtering of an NiO target using Ar ions, amorphous NiO exchange bias layers having a thickness of 175–500 Å have been produced, using for example, a silicon (Si) substrate heated to 60°–200° C., an ion beam voltage of 500–1000V and a beam current of 20 mA, with a deposition rate of about 0.1–0.2 Å/sec.

SUMMARY OF THE INVENTION

It is an object of the present invention to provide a unidirectional anisotropy in a ferromagnetic film by growing it on an antiferromagnetic buffer layer.

A further object of the invention is to grow oxide exchange bias layers (NiO, CoO, NiCoO) by sputtering of a metal oxide target.

A further object of the invention is to produce amorphous or crystalline NiO antiferromagnetic exchange bias layers by ion beam sputtering an NiO target in pure argon sputtering gas.

Another object of the invention is to provide a process for producing NiO exchange bias layers wherein no oxygen gas is introduced into the system.

Another object of the invention is to provide a process for fabricating NiO exchange bias layers using ion beam sputtering of an NiO target using pure argon ions with or without a heated substrate.

Other objects and advantages of the present invention will become apparent from the following description and accompanying drawings. Basically, the invention involves the growth of oxide exchange bias layers by ion beam sputtering of a metal oxide target. In accordance with the invention, amorphous or crystalline NiO antiferromagnetic exchange bias layers have been fabricated by ion beam sputtering an NiO target in pure argon sputtering gas. The process of this invention does not require the addition of oxygen gas to the sputtering gas, greatly simplifying the fabrication process. Thus, fabricating exchange bias films of NiO, CoO, and NiCoO and oxides can be carried out using the process of this invention. This process can be incorporated into the fabrication of non-volatile magnetic random access memory, and magnetic field sensors, as well as for producing antiferromagnetic oxide layers for use in magnetoresistive readback heads to shift the hysteresis loops of ferromagnetic films away from the zero field axis, which shift brings the most sensitive part of the magnetoresistance loop close to zero field.

BRIEF DESCRIPTION OF THE DRAWINGS

The accompanying drawings, which are incorporated into and form a part of the disclosure, illustrate an embodiment produced by the invention and an embodiment of an apparatus for carrying out the process of the invention and, together with the description, serve to explain the principles of the invention.

DETAILED DESCRIPTION OF THE INVENTION

Figure 1:
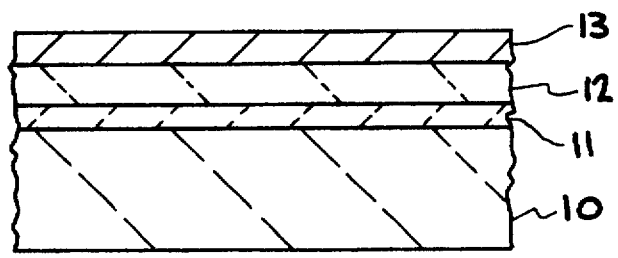
FIG. 1 is a partial, cross-sectional view of an embodiment of a device including an NiO exchange layer formed in accordance with the present invention.

The present invention is directed to the formation of oxide exchange bias layers by ion beam sputtering of a metal oxide target. Exchange biasing of ferromagnetic films using antiferromagnetic buffer layers is used, for example, in magnetoresistive sensors to linearize the measured signal and reduce noise. The coupling to the antiferromagnetic layer produces a unidirectional anisotropy in the ferromagnetic layer which shifts its magnetization loop away from the zero field axis. NiO, CoO, and NiCoO are attractive materials to use for biasing layers due to their high thermal stability and electrical resistance. NiO films have conventionally been grown by reactive magnetron sputtering of Ni targets in a partial pressure of argon and oxygen. The presence of oxygen in the formation process results in several problems: 1) requiring the control of the partial pressures of both the argon sputtering gas and the oxygen gas; 2) produces a detrimental effect on the other metal layers in the device, as well as on the deposition chamber itself, and 3) makes it difficult to grow the NiO exchange biasing layer on top of the NiFe layer.

In accordance with the process of the present invention NiO exchange bias layers have been fabricated using ion beam sputtering of an NiO target using argon (Ar) ions. No oxygen gas is introduced into the deposition system. In tests conducted to verify the process, embodiments were fabricated and which consists of a substrate 10, composed of silicon, glass, or ceramic, an optional amorphous $Al_2O_3$ film 11 having a thickness of 1000 Å, an NiO exchange film or layer 12 having a thickness of 400 Å or greater, and an NiFe layer or film 13 having a thickness of 50–300 Å. During fabrication, of the FIG. 1 embodiment, the temperature of substrate 10 was held between $-125°$ C. to $300°$ C., the ion beam voltage was 500–1000V and the beam current was 10–40 mA, and produced a deposition rate of about 0.2 Å on the substrate 10, with argon gas being at a pressure of $1 \times 10^{-4}$ to $4 \times 10^{-4}$ Torr. The resulting NiO film 12 was either amorphous or crystalline. The NiFe film 12 deposited on top of the NiO film 11 showed the desirable exchange-biased characteristic. A greater deposition rate up to several Å/sec. can be accomplished by using a larger ion gun with a higher ion current than 40 mA.

The resulting exchange bias field, of the FIG. 1 embodiment, in the easy axis direction was 180 e at room temperature. While substrate heating is not necessary, the temperature of the substrate may vary from about room temperature to $200°$ C. While NiO processing was carried out to verify the process of the invention, exchange bias films of CoO, NiCoO, and other oxides such as FeO, MnO, and mixtures thereof can be fabricated by this process, using different substrate temperatures and ion beam parameters. Also, other inert sputtering gases, such as Xe, Ne and Kr can be used.

Figure 2:
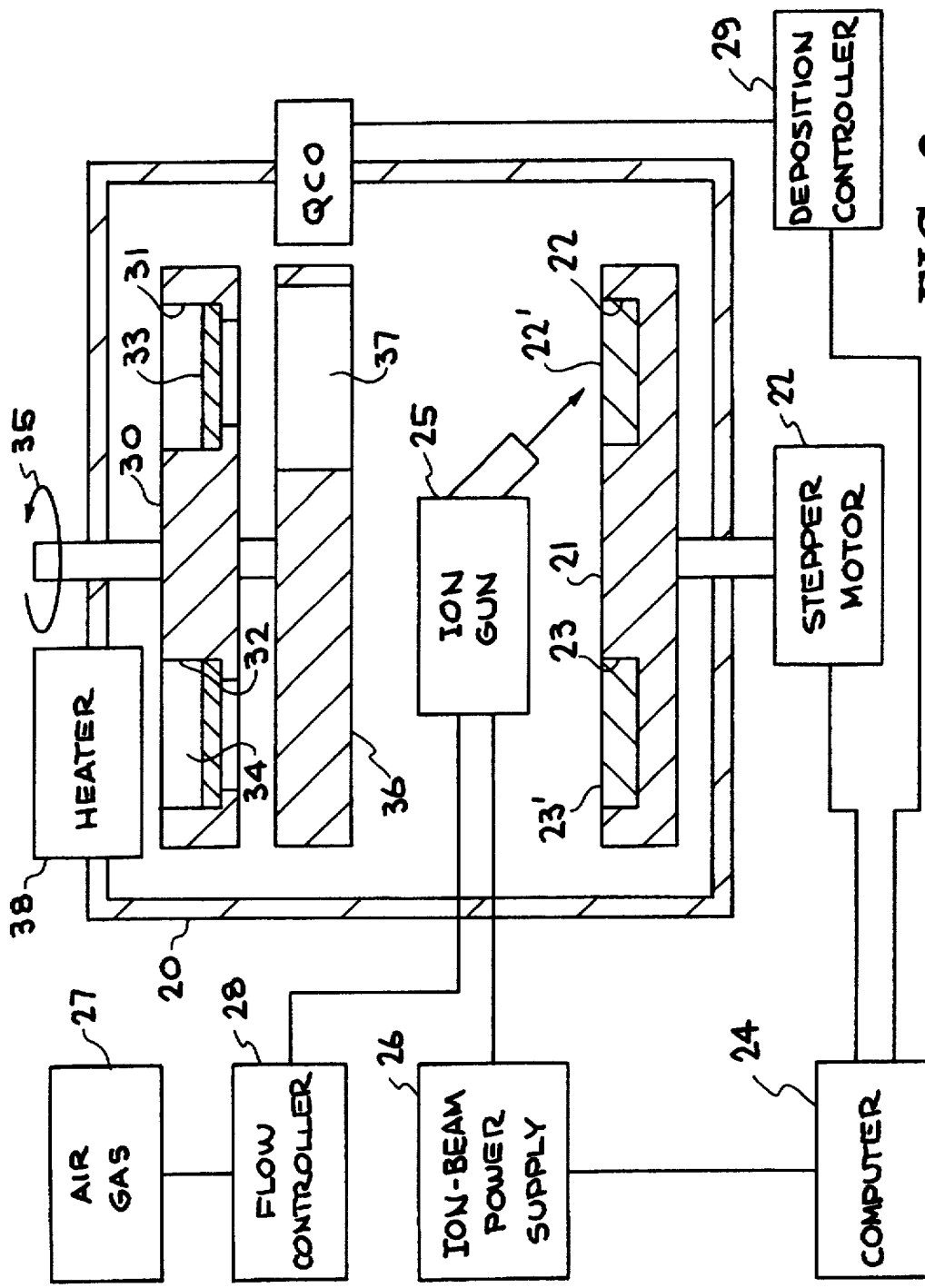
FIG. 2 is a schematic illustration of an apparatus for carrying out the invention.

FIG. 2 is a schematic illustration of a vacuum system used for carrying out the ion-beam sputter deposition (IBSD) technique in accordance with the process of the present invention, and which has been utilized for making other compositions of magnetic thin films with ion-beam sputter deposition. See R. P. Michel et al., "NiO Exchange Bias Layers Grown By Direct Ion Beam Sputtering of a Nickel Oxide Target", UCRL-JC-122960, bearing a date of Mar. 1, 1996.

In this sputter-up, facing-target apparatus, the ion gun sits at a fixed angle to targets which are mounted on a stepper-motor controlled carousel. No attempt was made to control the temperature of the targets. While insulating material targets may crack under the thermal stress of sputtering, this causes no problems as long as the target holder keeps the pieces in place.

In the apparatus shown in FIG. 2 substrates are mounted on a tray which is controlled using a linear/rotary motion feedthrough. One substrate at a time is rotated over a hole in a cryoshroud which is centered directly over the center of the target to be sputtered. Presputtering is performed while all substrates are rotated away from the deposition position. In this way the need for a mechanical shuttering system is avoided.

As shown in FIG. 2 the apparatus comprises a deposition chamber or housing 20 containing in a lower section thereof a carousel 21 mounted on a stepper-motor 22 located external of housing 20 and including target holders 22 and 23, only two shown containing targets 22' and 23' composed of NiO and NiFe, for example, with stepper-motor 22 being connected to a personal computer 24. An ion gun 25 is mounted in housing 20 and connected to an ion-beam power supply 26, which is connected to controller 24; with ion gun 25 also connected to an argon gas source 27 via a flow controller 28. A quartz-crystal oscillator (QCO) 28 is mounted in a wall of housing 20 and connected to controller 24 via a deposition controller 29. A rotable tray 30 having open pockets or holders 31 and 32 for retaining substrates 33 and 34 is mounted in an upper section of housing 20 and is controlled using a linear/rotary motion feedthrough indicated by arrow 35, which may be connected to controller 24. A cryoshield or cryoshroud 36 having an opening 37 is connected to tray 30 and located adjacent OCO 28. A substrate heater 38 is positioned in housing 20 and above the rotable tray 30, for heating either substrate 33 or 34. Depending on the materials involved, other inert sputter gases may be used, such as Xe, Ne and Kr.

In operation, with opening 37 of cryoshield 36, aligned with substrate 33 in holder 31 and centered directly over the center of target 22' using the sputter-up, facing-target arrangement shown in FIG. 2, the ion gun 25 sits at a fixed angle with respect to target 22' as shown. Energy from ion gun 25, as indicated by arrows 39 is directed onto target 22' causing sputter deposition of the material of target 22' onto substrate 33, with the cryoshield 36 preventing deposition of the target material on the rotating tray 30. One substrate (33 or 34) at a time is rotated over the opening 37 in the cryoshield 36, and carousel 21 is rotated as desired whereby either material from target 22' or target 23' is deposited on either substrate 33 or 34. Presputtering is performed while all substrated are rotated away from the deposition position, or cryoshield 36 is rotated where opening 37 does not align with a substrate holder. While two target holders and two substrate holders are shown, additional holders may be provided to selectively deposit material on a greater number of substrates, and/or to selectively use a greater number of different target materials.

Making a complex structure like a magnetic multilayer requires switching from one material to another rapidly. With an IBSD system the change of target is particularly simple. The reason is that there are two processes going on with an ion gun: the ionization of sputter gas atoms, and the acceleration of the ions. Both processes are needed to produce the energetic (~keV) ions necessary to eject material from the target. The acceleration of the ions can be halted within a few seconds by lowering the voltage on the grids that make up the ion-focusing optics. Thus an IBSD system can have an "electrical shutter" instead of electro-mechanical or pneumatic ones. While the ion-acceleration voltage is low, the user simply moves a new target into the position in front of the ion gun. In the deposition chamber shown in FIG. 2, the change of targets is accomplished using a stepper-motor-driven rotary-motion feedthrough.

Figure 3A:
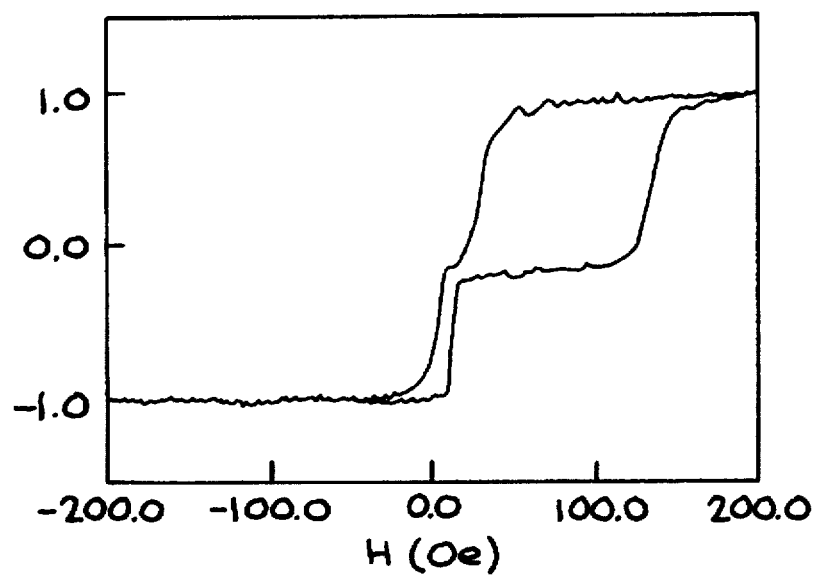
FIGS. 3A and 3B show respective magnetoresistance and magnetization data for a film grown by ion-beam sputter deposition.
Figure 3B:
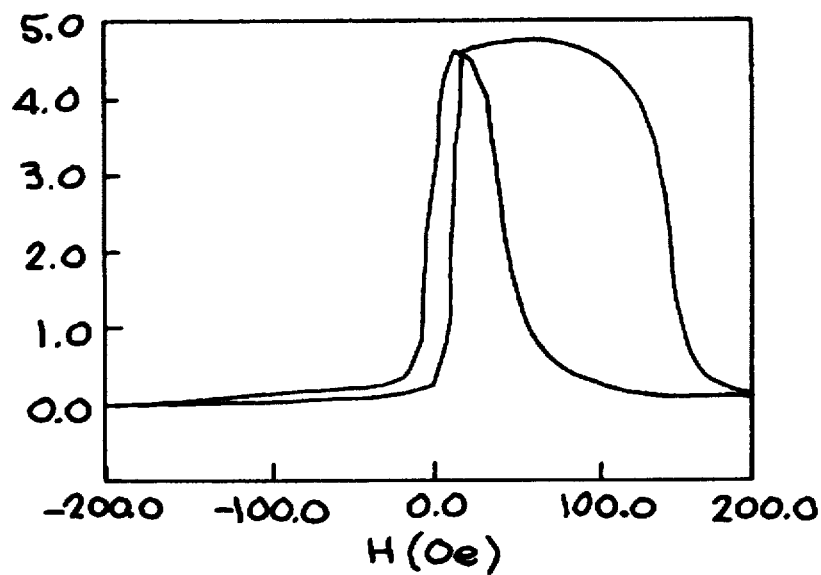

FIGS. 3A and 3B show magnetoresistance and magnetization data for a spin-valve film, one type of film that may be used in a magnetoresistive readback head. The layering for this film is NiFe50 Å/Co10 Å/Cu30 Å/Co50 Å/NiO 500 Å/Si substrate. This film was grown via IBSD using deposition parameters which were separately optimized for the different constituent materials. One advantage of IBSD is that within a limited range the ion-beam energy, ion-beam current and background gas pressure can be varied independently of one another. This allows the film grower with an automated deposition system to specify different process parameters for each of the materials to be incorporated into a device. Experience with IBSD has shown that some technologically important materials like NiFe have materials properties which are sensitive to each of the ion-beam parameters as well as to substrate temperature and dc substrate bias.

The magnetization curve of FIG. 3A shows that the NiFe and Co layers of spin-valve switch at different characteristic fields. This differential switching is at the heart of the operation of spin-valve sensors, which are expected to play a major role in the next generation of magnetic recording heads and other thin-film sensors. FIG. 3B illustrates the "giant magnetoresistance" that accompanies the differential switching of the magnetic layers. Considerably larger magnetoresistance can be achieved in IBSD films by varying the thickness and number of layers that make up the spin-valve. IBSD appears to be a viable method for rapid and reliable fabrication of spin-valve films that incorporate oxide exchange-bias layers.

It has thus been shown that the present invention enables the formation of oxide exchange bias layers by ion beam sputtering of a metal oxide target in an argon sputtering gas, and without introduction of oxygen gas into the deposition system. This process enables the making of exchange bias films of NiO, CoO, NiCoO, and other oxides. By elimination of oxygen gas during the deposition process, the process is made simpler and the problems associated with oxygen incorporation during deposition of metal films are eliminated. The process of this invention provides antiferromagnetic oxide layers, which in addition to use in magnetoresistive readback heads, they can be incorporated in nonvolatile magnetic random access memory systems and magnetic field sensors.

While a particular embodiment, apparatus and operational sequence, along with specific materials, parameters, etc. have been set forth to exemplify and teach the principles of the invention, such are not intended to be limiting. Modifications and changes may become apparent to those skilled in the art and it is intended that the invention be limited only by the scope of the appended claims.

The invention claimed is:

1. In a process for forming an oxide exchange bias layer, the improvement comprising:
   depositing the oxide layer by ion beam sputtering of a metal oxide target in an atmosphere consisting of an inert sputtering gas,
   whereby ion beam sputtering is carried out in the absence of oxygen gas.

2. The improvement of claim 1, wherein ion beam sputtering is carried out in the presence of a sputtering gas selected from the group consisting of argon, xenon, neon, and krypton.

3. The improvement of claim 1, wherein the depositing of the oxide layer was carried out at a rate of about 0.1–0.2 Å/sec.

4. The improvement of claim 1, wherein the metal oxide target is composed of material selected from the groups consisting of NiO, CoO, NiCoO, FeO and MnO.

5. The improvement of claim 1, wherein the metal oxide target is composed of NiO and the sputtering gas consists of argon.

6. The improvement of claim 5, wherein the deposited oxide layer is composed of NiO, and the ion beam sputtering is carried out using an ion beam voltage of about 500–1000 V and an ion beam current of about 10–40 mA.

7. The improvement of claim 1, wherein the substrate is heated and held at a temperature ranging from −125° C. to 200° C. during deposition of an oxide layer composed of NiO.

8. The improvement of claim 1, additionally including:
   providing a substrate on which the oxide layer is to be deposited;
   provide a metal oxide target composed of NiO;
   providing a sputtering gas consists of argon; and
   positioning an ion gun at an angle with respect to the metal oxide target;
   and directing an ion beam from the ion gun at an angle onto the metal oxide target causing sputtering off of target material and depositing of the sputtered material onto the substrate.

9. The improvement of claim 8, additionally including providing control means for the ion gun, for positioning the target, for positioning the substrate, and for controlling the deposition rate of sputtered material.

10. The improvement of claim 8, additionally including providing shield means for the substrate.

11. The improvement of claim 8, additionally including providing a rotating means for holding different composition targets.

12. A process for forming antiferromagnetic NiO layers for use in magnetoresistive readback heads, magnetic random access memories, magnetic field sensors, etc., comprising:
   providing a deposition chamber;
   providing an NiO target;
   providing a substrate;
   directing an ion beam onto the NiO target in the presence of argon gas and absence of oxygen gas causing sputter deposition of the NiO of the target onto the substrate.

13. The process of claim 12, additionally including heating the substrate.

14. The process of claim 12, additionally including providing a rotable means containing the NiO target and at least one additional target of a different composition.

* * * * *